United States Patent [19]

van de Plassche et al.

[11] 4,280,089
[45] Jul. 21, 1981

[54] AUTOMATIC INCREMENTING ATTENUATION ARRANGEMENT

[75] Inventors: Rudy J. van de Plassche; Eise C. Dijkmans, both of Eindhoven, Netherlands

[73] Assignee: U.S. Philips Corporation, New York, N.Y.

[21] Appl. No.: 88,734

[22] Filed: Oct. 26, 1979

[30] Foreign Application Priority Data

Nov. 14, 1978 [NL] Netherlands .......................... 7811229

[51] Int. Cl.³ .............................................. G05F 3/08
[52] U.S. Cl. .................................................. 323/354
[58] Field of Search .................... 323/8, 19, 74, 79, 80; 333/81 R

[56] References Cited

U.S. PATENT DOCUMENTS

| | | | |
|---|---|---|---|
| 3,262,049 | 7/1966 | Watson et al. | 323/80 |
| 3,370,181 | 2/1968 | Sitomer | 333/81 R |
| 3,403,324 | 9/1968 | Bradley | 323/80 |
| 3,441,835 | 4/1969 | Hekrdle | 323/80 |
| 3,977,291 | 8/1976 | Southard | 323/80 X |

FOREIGN PATENT DOCUMENTS 2758310 7/1979 Fed. Rep. of Germany ............. 323/80

*Primary Examiner*—A. D. Pellinen
*Attorney, Agent, or Firm*—Thomas A. Briody; William J. Streeter; Edward W. Goodman

[57] ABSTRACT

Attenuation arrangement comprising a step attenuator arranged in cascade with a controllable voltage divider via first and second voltage terminals, the step attenuator comprising a series arrangement of attenuation elements for dividing a voltage applied across said series arrangement into a plurality of voltage increments, which voltage increments are individually switchable between the two voltage terminals for varying the output voltage of the controllable voltage divider for the voltage range of the relevant voltage element, the direction of the polarity of the voltage between the two voltage terminals changing at a switch-over from one voltage increment to an adjacent voltage increment.

4 Claims, 4 Drawing Figures

AUTOMATIC INCREMENTING ATTENUATION ARRANGEMENT

BACKGROUND OF THE INVENTION

The invention relates to an attenuation arrangement comprising a step attenuator having an input, through which first and second voltage terminals are arranged in cascade with a voltage divider having an output, said attenuation arrangement also comprising a control circuit having a control input for controlling the step attenuator and the controllable voltage divider, the step attenuator having, connected between the input and a reference terminal, a series arrangement of attenuator elements which are connectable in parallel with the two voltage terminals.

Such an attenuation arrangement is known from Dutch patent application No. 300875, which has been laid open to public inspection.

The step attenuator of the known attenuation arrangement distributes an input voltage applied between the input and the reference terminal over the attenuation elements in a plurality of voltage increments. By connecting one of these attenuation elements in parallel with the two voltage terminals, the voltage increment present across this attenuation element is applied to the controllable voltage divider via the voltage terminals. Herein a voltage value located within the range of the voltage increment is connected to the output of the controllable voltage divider.

An increase in the output voltage over the range of the voltage increments of two adjacent attenuation elements is realized in the known attenuation arrangement as follows. After the highest position of the controllable voltage divider has been attained, wherein the highest voltage value of the voltage increment applied between the two voltage terminals is connected to the output, the two ends of the relevant attenuation element are disconnected from the two voltage terminals under the control of the control circuit and the two corresponding ends of the next attenuation element are connected to the two voltage terminals. The controllable voltage divider is now adjusted from the last-mentioned highest position to the lowest position, wherein the lowest voltage value of the voltage increment between the two voltage terminals is connected to the output. The output voltage can now increase further over the range of the higher voltage increment. A decrease of the output voltage over the range of two adjacent attenuation elements is realized by reversing the above method.

The switching actions which must be performed to switch from one voltage increment to the other produce voltage peaks which may become apparent in an unacceptable manner. When this attenuation arrangement is used as, for example, the volume control in wireless sets, these voltage peaks become audible as plopping sounds

SUMMARY OF THE INVENTION

It is an object of the invention to provide an attenuation arrangement wherein a variation in the output voltage over two consecutive voltage increments is realized with a minimum number of switching actions, switching peaks being prevented from occurring.

According to the invention an attenuation arrangement of the type mentioned in the opening paragraph is therefore characterized in that when switching the two voltage terminals from a first to an adjacent second attenuation element under the control of the control circuit, the connection of the common junction between the two attenuation elements and one of the two voltage terminals is maintained and the connection from the other voltage terminal to the end of the first attenuation element located opposite this junction is switched over to the end of the second attenuation element located opposite this junction.

When using this measure according to the invention, the switching actions are limited to breaking the connection of the end of the first attenuation element located opposite said junction and one of the two voltage terminals and connecting the end of the second attenuation element, also located opposite this junction, to the last-mentioned voltage terminal. In response thereto the polarity of the voltage between the two voltage terminals changes, resulting, the position of the controllable voltage divider not being changed, in that the lowest voltage value of the voltage increment connected between the voltage terminals or viceversa is now connected to the output instead of the highest voltage value. Consequently, a switch-over in the controllable voltage divider can now be omitted.

A further advantage of the maintained connection of the common junction between the two attenuation elements and one of the two voltage terminals during switching is that the voltage at this voltage terminal, this voltage being connected to an output terminal as the output voltage via the voltage divider, is kept at a fixed value, thus preventing switching peaks.

A preferred embodiment of an attenuation arrangement according to the invention is characterized in that the controllable voltage divider comprises a series arrangement of attenuation elements connected between the two voltage terminals, each end of the attenuation elements being individually connectable to an output of the attenuation arrangement under the control of the control circuit.

When this measure is used the controllable voltage divider has a discrete implementation and the control thereof can be realised by means of a simple control circuit.

A still further preferred embodiment of such an attenuation arrangement is characterized in that the control input of the control circuit comprises first and second control terminals coupled to a pulse generator, these elements being connected in a switchable manner to an adding device for adding the pulses applied to the first control terminal and for subtracting the pulses applied to the second control terminal, the adding device being connected to a switching control device for converting the output signal of the adding device into a switching control signal for the step attenuator and the controllable voltage divider, a pulse train applied to the adding device via one of the two control terminals producing an increase and a pulse train applied to the adding device via the other control terminal producing a decrease of the output voltage of the attenuation arrangement.

When using this measure the whole attenuation arrangement is integratable.

Another preferred embodiment of an attenuation arrangement according to the invention is characterized in that the attenuation elements of the step attenuator divides a voltage applied between the input and the reference terminal into partial voltages which have a mutual logarithmic relationship.

When using this measure a logarithmic voltage variation takes place which is desired, inter alia for controlling the volume of audio signals.

DESCRIPTION OF THE DRAWINGS

The invention will now be further explained by way of non-limitative example with reference to the Figures shown in the drawings.

Herein.

DESCRIPTION OF THE PREFERRED EMBODIMENT

Figure 1:
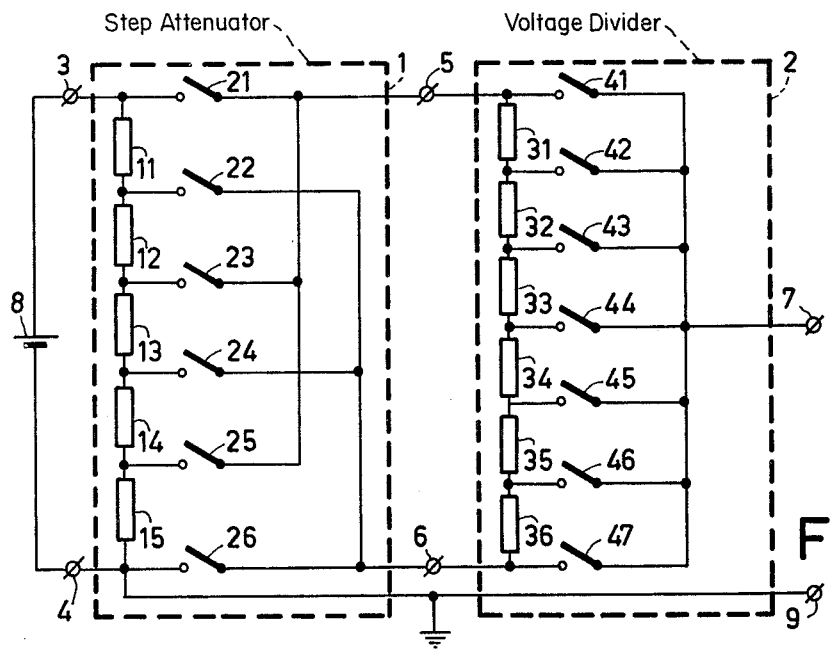
FIG. 1 shows a circuit diagram of the step attenuator and the controllable voltage divider of the attenuation arrangement according to the invention.

FIG. 1 shows a step attenuator 1 which is arranged in cascade with a controllable voltage divider 2 via first and second voltage terminals 5 and 6. The step attenuator 1 comprises an input 3 and a reference terminal 4 which is coupled to ground, a voltage source 8 being connected therebetween and comprises a series arrangement of resistors 11 to 15 inclusive, operating as attenuation elements and connected between the input 3 and the reference terminal 4. The resistor 11 is connectable between the voltage terminals 5 and 6 by means of switches 21 and 22, the resistor 12 by means of switches 23 and 22, the resistor 13 by means of switches 23 and 24, the resistor 14 by means of the switches 25 and 24 and the resistor 15 by means of the switches 25 and 26.

The controllable voltage divider 2 comprises a series arrangement, connected between the voltage sources 5 and 6, of resistors 31 to 36, inclusive, which operate as attenuation elements. The ends of these resistors 31 to 36, inclusive, are individually connected in a switchable manner to an output 7 of the controllable voltage divider 2 via a parallel arrangement of switches 41 to 47, inclusive respectively. The output voltage is measured at the output 7 with respect to an output reference terminal 9 connected to the reference terminal 4.

At a voltage V of the voltage source 8 and equal resistors 11 to 15, inclusive, the voltage terminal 6 is connected to ground and the voltage terminal 5 to a voltage of 1/5 V by closing the switches 25 and 26. The output voltage at the output 7 can now be brought to a voltage value in the range from 0 to 1/5 V inclusive, by closing one of the switches 41 to 47, inclusive.

When resistors 31 to 36, inclusive, are equal, the output voltage can be brought to 1/30 V, for example by closing switch 46. By opening switch 46 and closing switch 47 the output voltage is brought to 2/30 V. In this manner the output voltage can increase in steps of 1/30 V to the maximum value (1/5 V) of the voltage increment between the voltage terminals 5 and 6. The switch 41 is then closed and the switches 42 to 47, inclusive, are opened.

A further increase in the output voltage is possible by transferring the voltage increment of the next resistor 14 to the voltage terminals 5 and 6. According to the invention this is realised by opening the switch 26 and closing the switch 24, the switch 25 remaining in the closed condition. As a result thereof a voltage of 1/5 V remains connected to the voltage terminal 5 whereas a voltage of 2/5 V is now applied to the voltage terminal 6. The controllable voltage divider 2 which connected the highest voltage value (1/5 V) of the preceding voltage increment to the output 7, the switch 41 being in the closed condition, now passes, the switch 41 remaining in the closed condition, the lowest voltage value (1/5 V) of the new voltage increment (1/5 V–2/5 V). The polarity of the voltage between the voltage terminals 5 and 6 is now opposite to the polarity of the preceding voltage increment. The output voltage can now further increase in increments of 1/30 V until 2/5 V by sequentially switching the switches 42 to 47, inclusive.

A further increase in the output voltage after 2/5 V has been reached on closing of the switch 47 is rendered possible by transferring the voltage increment of the next resistor 13 to the voltage terminals 5 and 6. According to the invention this is realised by opening the switch 25 and closing the switch 23. The polarity of the voltage between the voltage terminals 5 and 6 changes: a voltage of 3/5 V is connected to the voltage terminal 5 and a voltage of 2/5 V is connected to the voltage terminal 6. The output voltage can now further increase over this voltage increment from 2/5 V to 3/5 V in steps of 1/30 V by sequentially switching the switches 46 to 41, inclusive.

In the above-described manner it is possible to have the output voltage increase in steps of 1/30 V over the following voltage increments (3/5 V–4/5 V) and (4/5 V–5/5 V).

The output voltage is decreased by performing the switching actions in the inverse sequence.

The controllable voltage divider 2 which subdivides the voltage applied to the voltage terminals 5 and 6 into discrete voltage levels, may now be replaced by an analog voltage divider, for example a potentiometer or a circuit as described in the Netherlands patent application OA No. 1,802,973. Such a construction, not shown, has the advantage that, with the above-described switching mode in the step attenuator no switching actions occur in the controllable voltage divider so that switching peaks are completely avoided.

Figure 1A:
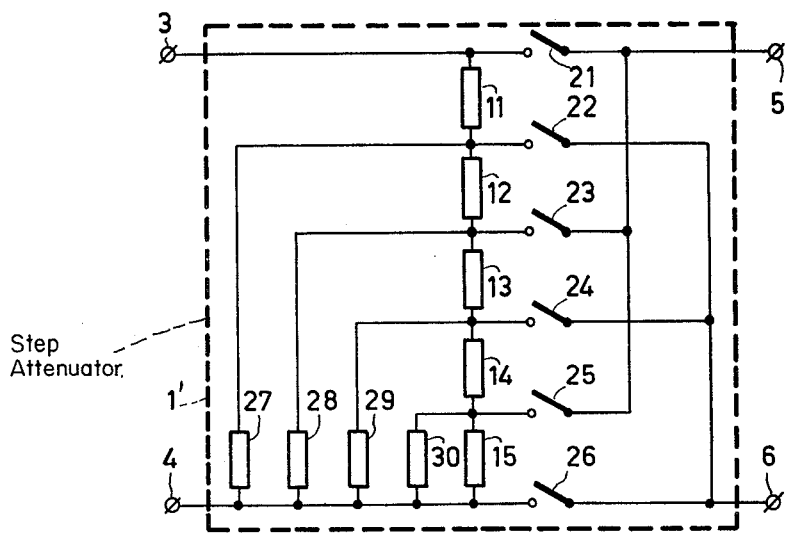
FIG. 1a shows a logarithmic step attenuator.

FIG. 1a shows a step attenuator 1' having a logarithmic voltage division function. The elements corresponding to the elements of the step attenuator shown in the preceding figure have been given the same reference numerals. The step attenuator 1' comprises resistors 27, 28, 29 and 30, one end of which is connected to the reference terminal 4, the other end being connected to the common junctions of the resistors 11 and 12, 12 and 13, 13 and 14 and 14 and 15, respectively.

When the resistors 15 and 27 to 30, inclusive, have a value of 2 R and the resistors 11 to 14, inclusive, a value of R, the total value of resistors 15 and 30 becomes R, which also applies to the total value of the resistors 14, 15, 29 and 30; 13, 14, 15, 28, 29 and 30; 12, 13, 14, 15, 27, 28, 29 and 30. If the input 30 is brought to a voltage value V and the reference voltage 4 is connected to ground a voltage of ½ V is present at the common junction of the resistors 11, 12, and 27; a voltage ¼ V at the common junction of the resistors 12, 13 and 28; a voltage ⅛ V at the common junction of the resistors 13, 14 and 29; a voltage 1/16 V at the common junction of the resistors 14, 15 and 30. In the said sequence the voltage at the junctions decreases by a factor of ½. Such a voltage distribution is advantageous for, for example, volume controls in audio amplifiers.

Figure 1B:
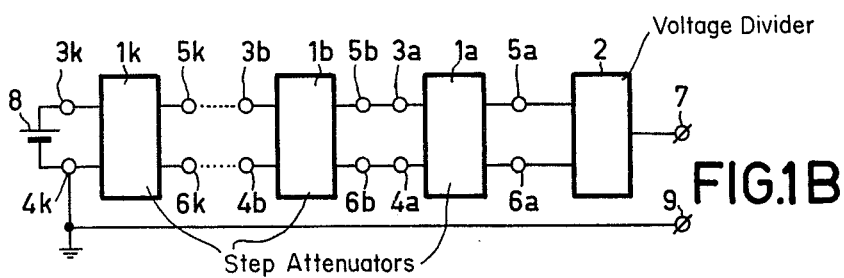
FIG. 1b shows a construction of an attenuation arrangement wherein a plurality of step attenuators and a controllable voltage divider are arranged in cascade.

FIG. 1b shows a cascade arrangement of step attenuators 1a to 1k, inclusive, and the controllable voltage divider 2, the step attenuators 1a to 1k being identical to the step attenuator 1. The voltage source 8 is connected between input 3k and the reference terminal 4k of the step attenuator. The reference terminal 4k is connected to ground and is coupled to the output reference terminal 9.

Assuming that in an internal switching configuration as shown in FIG. 1, there are $N_o$ attenuation elements in the controllable voltage divider 2, and $N_1$ to $N_k$, inclusive, attenuation elements in the step attenuators 1a to 1k, inclusive, respectively, $N_O$ to $N_k$, inclusive, being equal to or greater than 3, it is possible to realise with such a cascade arrangement $$1 + \prod_{j=o}^{k} N_j$$

different voltage levels by means of $$k + \prod_{j=o}^{k} N_j$$

switches.

A maximum number of different voltage levels is achieved with a minimum number of switches when $N_j = N_{j+1} = 2$ (j=o ... -k-1). The number of different voltage levels is $1 + 2^k$, the number of switches $2k+1$.

Figure 2:
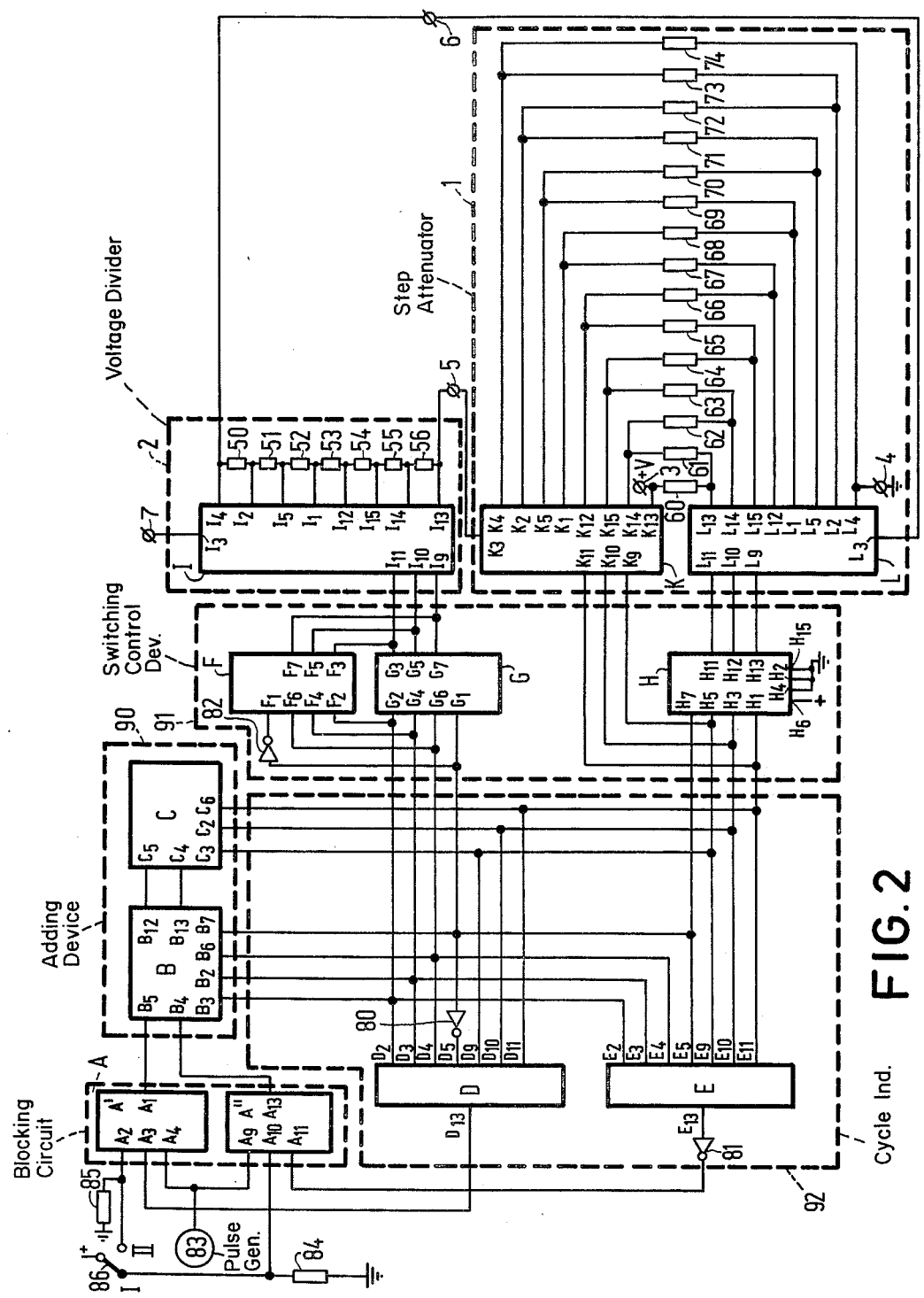
FIG. 2 shows a practical embodiment of an integratable attenuation arrangement according to the invention.

FIG. 2 shows an integratable attenuation arrangement according to the invention wherein the terminals 3 to 7 correspond to terminals of FIG. 1, having the same reference numerals. The step attenuator 1 and the controllable voltage divider 2 have the same function as those in FIG. 1. The control of the step attenuator 1 and the controllable voltage divider 2 is realised by means of a control circuit comprising a change-over switch 86, a clock pulse generator 83, which is coupled to an adding device 90 via a blocking circuit A, a cycle indicator 92 coupled between an output of the adding device 90 and an input of the blocking circuit A and a switching control device 91, which is also coupled to the output of the adding device 90 and is also connected to the step attenuator 1 and the controllable voltage divider 2 for applying switching control signals thereto.

The above-mentioned circuits and devices are implemented by means of integrated circuits full details of which are included in the Philips Data Handbook "Semiconductors and Integrated Circuits", part 6, May 1976. The connecting terminals of these integrated circuits are denoted in the present Figure by means of a letter and an index. This index denotes the number of the terminal of the relevant connecting terminal as mentioned in said Philips Data Handbook. The voltage supply terminals as well as the connecting terminals which are not relevant to the said control have not been shown.

The blocking circuit A comprises an integrated circuit of the type HEF 4012 P, which includes two NAND gates A' and A" having input terminals $A_2$ to $A_4$, inclusive, and $A_9$ to $A_{11}$, inclusive, respectively. The input terminals $A_2$ and $A_{10}$ are connected to ground via resistors 85 and 84, respectively, and are interchangeably connected to a positive supply voltage via the change-over switch 86; in a position I of the change-over switch 86 the input terminal $A_{10}$ is connected to the supply voltage, in a position II the input terminal $A_2$ is connected to the supply voltage. The input terminals $A_4$ and $A_9$ function as the first and second control terminals of the control circuit and are coupled to an output of the clock pulse generator 83, which produces positive pulses with a frequency of approximately 10 Hz. The input terminals $A_3$ and $A_{11}$ are connected to an output of the cycle indicator 92.

The adding device 90 comprises two integrated circuits B and C of the type HEF 40193 P having input terminals $B_4$, $B_5$ and $C_4$, $C_5$ and output terminals $B_3$, $B_2$, $B_6$, $B_7$ and $C_3$, $C_2$, $C_6$, respectively. One end of the integrated circuit B is coupled to the output terminals $A_1$ and $A_{13}$ of the NAND-gates A' and A" via the input terminals $B_5$ and $B_4$, the other end to the input terminals $C_5$ and $C_4$ of the integrated circuit C via borrow bit output terminals $B_{12}$ and $B_{13}$.

The sum of the pulses applied to the input terminal $B_5$ is presented in the form of a binary-decimal number to the output terminals $B_3$, $B_2$, $B_6$, $B_7$, $C_3$, $C_2$ and $C_6$, the bit significance increasing in this sequence from $2^0$ to $2^6$. A high terminal voltage, to be denoted 1-voltage hereinafter, corresponds to the binary value 1 and a low terminal voltage, to be denoted 0-voltage hereinafter, corresponds to the binary value 0. Pulses applied to the input terminal $B_4$ reduce the binary-decimal number at the last-mentioned output terminals.

The cycle indicator 92 comprises an integrated NAND-gate D of the type HEF 4068 P, having input terminals $D_2$ to $D_5$, inclusive and $D_9$ to $D_{11}$, inclusive and an output terminal $D_{13}$, as well as an integrated NOR-gate E of the type HEF 4078 P, having input terminals $E_2$ to $E_5$, inclusive and $E_9$ to $E_{11}$, inclusive and an output terminal $E_{13}$. The output terminal $D_{13}$ is coupled to the input terminal $A_3$ of the NAND-gate A', the output terminal $E_{13}$ to the input terminal $A_{11}$ of the NAND-gate A" via an inverter 81. The input terminal $D_5$ of the NAND-gate D is coupled to the output terminal $B_7$ of the adding device 90 via an inverter 80, the other input terminals $D_2$ to $D_4$, inclusive and $D_9$ to $D_{11}$, inclusive are coupled to the output terminals $B_3$, $B_2$, $B_6$, $C_3$, $C_2$ and $C_6$, respectively. The input terminals $E_2$ to $E_5$, inclusive and $E_9$ to $E_{11}$, inclusive, of the NOR-gate E are also coupled to the output terminals $B_3$, $B_2$, $B_6$, $B_7$, $C_3$, $C_2$, $C_6$, respectively, of the counting device 90.

For a numerical value of the binary-decimal number at the output terminals $B_3$, $B_2$, $B_6$, $B_7$, $C_3$, $C_2$ and $C_6$ of the adding device 90 in the range from 1 to 118, inclusive, (that is to say from 1000000 to 0110111), the 1-voltage and the 0-voltage are connected to the output terminals $D_{13}$ and $E_{13}$, respectively, of the cycle indicator 92. The 0-voltage at the output terminal $E_{13}$ is converted into the 1-voltage by the inverter 81, this voltage being applied to the input terminal $A_{11}$ of the NAND-gate A".

In position II of the change-over switch 86 an 1-voltage is also applied to the input terminal $A_2$ of this NAND-gate A'. A 0-voltage is then present at the input terminal $A_{10}$ of the NAND-gate A", so that this gate is kept in the closed condition. The NAND-gate A' is conductive for the positive clock pulses of the clock pulse generator 83, which are applied to the input terminal $A_4$. These clock pulses appear at the output terminal $A_1$, are applied to the input terminal $B_5$ of the adding device 90 and added to the binary-decimal number at the output terminals thereof. When this binary-decimal number reaches the value 119 (that is to say 1110111), then the 0-voltage appears at the output terminal $D_{13}$, so that the NAND-gate A' is blocked. The transfer of further clock pulses from the clock pulse generator 83 to the adding device 90 is then blocked.

If, thereafter, the change-over switch 86 is switched to position I, then a 0-voltage is applied to the input terminal $A_2$ of the NAND-gate A' in response to which this gate is blocked, also for other values of the said binary-decimal number. A 1-voltage is applied to the input terminal $A_{10}$ of the NAND-gate A'' via the change-over switch 86. A 1-voltage is applied to the input terminal $A_{11}$ via the inverter 81. The NAND-gate A'' is then conductive for the clock pulses of the clock pulse generator 83 and it passes these clock pulses to the input terminal $B_4$ of the adding device 90 via the output terminal $A_{13}$. The clock pulses reduce the numerical value of the binary-decimal number at the output terminals $B_3$, $B_2$, $B_6$, $B_7$, $C_3$, $C_2$ and $C_6$. When the value 0 is reached (that is to say 0000000) then there appears at the output terminal $E_{13}$ the 1-voltage which is converted into the 0-voltage in the inverter 81. This 0-voltage blocks the NAND-gate A'', in response to which the transfer of further clock pulses to the adding device 90 is blocked.

Consequently the counting cycle comprises 120 different numerical values from 0000000 to 1110111, respectively, the direction of the counting cycle being determined by the position of change-over switch 86.

The switching control device 91 comprises an integrated buffer circuit G of the type HEF 40097 P and an integrated inverting buffer circuit F of the type HEF 40098 P for the generation of one switching control signal for the controllable voltage divider 2, as well as an integrated adding circuit H of the type HEF 4008 P for the generation of a switching control signal for the step attenuator 1. The controllable voltage divider 2 comprises an integrated multiplex circuit I of the type HEF 4051 P and the step attenuator 1 comprises two multiplex circuits K and L, also of the type HEF 4051 P.

The multiplex circuit I has input terminals $I_9$ to $I_{11}$, inclusive and output terminals $I_1$ to $I_5$, inclusive and $I_{12}$ to $I_{15}$, inclusive, the output terminal $I_3$ being internally through-connected to one of the said further output terminals $I_1$, $I_2$, $I_4$, $I_5$ and $I_{12}$ to $I_{15}$, inclusive, in dependence on the numerical value of the binary signal at the input terminals $I_{11}$, $I_{10}$ and $I_9$ (from 000 to 111).

The multiplex circuit K, having input terminals $K_9$ to $K_{11}$, inclusive, and output terminals $K_1$ to $K_5$, inclusive and $K_{12}$ to $K_{15}$, inclusive, and also the multiplex circuit L, having input terminals $L_9$ to $L_{11}$, inclusive and output terminals $L_1$ to $L_5$, inclusive and $L_{12}$ to $L_{15}$, inclusive, operate in a similar manner.

Resistors 50 to 56, inclusive, are connected between the output terminals $I_4$ and $I_2$, $I_2$ and $I_5$, $I_5$ and $I_1$, $I_1$ and $I_{12}$, $I_{12}$ and $I_{15}$, $I_{15}$ and $I_{14}$, $I_{14}$ and $I_{13}$, respectively. The output terminal $I_3$ is connected to an output 7 of the attenuation arrangement. In the integrated multiplex circuit I the same switching functions have been realised as those obtained by means of the switches 41 to 47, inclusive, of the controllable voltage divider shown in FIG. 1.

The resistors 60 to 74, inclusive, are connected between the output terminals $K_{13}$ and $L_{13}$, $L_{13}$ and $K_{14}$, $K_{14}$ and $L_{14}$, $L_{14}$ and $K_{15}$, $K_{15}$ and $L_{15}$, $L_{15}$ and $K_{12}$, $K_{12}$ and $L_{12}$, $L_{12}$ and $K_1$, $K_1$ and $L_1$, $L_1$ and $K_5$, $K_5$ and $L_5$, $L_5$ and $K_2$, $K_2$ and $L_2$, $L_2$ and $K_4$, $K_4$ and $L_4$, respectively. The output terminal $K_3$ is coupled to the output terminal $I_{13}$ via the voltage terminal 5 and the output terminal $L_3$ to the output terminal $I_4$ via the voltage terminal 6. The output terminal $K_{13}$ is connected to a positive voltage V to be distributed, via the input 3 of the attenuation arrangement, and the output terminal $L_4$ is connected to ground via the reference terminal 4.

The same switching functions are realised in the integrated multiplex circuit K as those obtained by means of the switches 21, 23 and 25 of the step attenuator 1 of FIG. 1, the same switching functions being realised in the integrated multiplex circuit L as those obtained by means of the switches 22, 24 and 26 of this step attenuator.

The output terminals $B_3$, $B_2$, $B_6$ and $B_7$ of the adding device 90 are connected to input terminals $G_2$, $G_4$, $G_6$ and $G_1$, respectively, of buffer circuit G and to input terminals $F_2$, $F_4$, $F_6$ and $F_1$, respectively, of the inverting buffer circuit F, an inverter 82 being included between the output terminal $B_7$ and the input terminal $F_1$. Output terminals $G_3$, $G_5$ and $G_7$ of the buffer circuit G and output terminal $F_2$, $F_5$ and $F_7$ of the inverting buffer circuit F are coupled to the input terminals $I_{11}$, $I_{10}$ and $I_9$, respectively, of the multiplex circuit I.

The buffer circuit G transfers the voltage applied to the input terminals $G_2$, $G_4$ and $G_6$ to the output terminals $G_3$, $G_5$ and $G_7$, respectively, when an 0-voltage is present at the input terminal $G_1$. When this 0-voltage is changed into a 1-voltage, the voltage transfer from the input to the output terminals is blocked. The inverting buffer circuit F operates in the same manner but transfers the voltage at the input terminals $F_2$, $F_4$ and $F_6$ in the inverted version to the output terminals $F_3$, $F_5$ and $F_7$, respectively.

The output terminals $B_7$, $C_3$, $C_2$ and $C_6$ of the adding device 90 are coupled to input terminals $H_7$, $H_5$, $H_3$ and $H_1$, respectively, of the adding circuit H. The output terminals $C_3$, $C_2$ and $C_6$ are also coupled to the input terminals $K_9$, $K_{10}$ and $K_{11}$, respectively, of the multiplex circuit K. Output terminals $H_{11}$, $H_{12}$ and $H_{13}$ of the adding circuit H are connected to input terminals $L_{11}$, $L_{10}$ and $L_9$, respectively, of the multiplex circuit L. By connecting the input terminal $H_6$ to the 1-voltage and the input terminals $H_4$, $H_2$ and $H_{15}$ to a 0-voltage (ground), a binary signal 1000 is applied to further input terminals $H_6$, $H_4$, $H_2$ and $H_{15}$ of the adding circuit H. The adding circuit H produces at the output terminals $H_{11}$, $H_{12}$ and $H_{13}$ the most significant bits of the sum of the binary-decimal number present at the input terminals $H_7$, $H_5$, $H_3$, $H_1$ and the (constant) binary-decimal number 1000, applied to the input terminals $H_6$, $H_4$, $H_2$ and $H_{15}$.

The binary-decimal number at the input terminals $I_{11}$, $I_{10}$ and $I_9$ of the multiplex circuit I alternately cycles through the number cycle from 0 to 7, inclusive (000 to 111, inclusive) and from 7 to 0, inclusive, (111 to 000, inclusive), at a continuous increase or decrease of the binary number at the output terminals $B_3$, $B_2$, $B_6$ and $B_7$. In this manner one of the output terminals $I_4$, $I_2$, $I_5$, $I_1$, $I_{12}$, $I_{15}$, $I_{14}$, $I_{13}$ is successively connected to the output terminal $I_3$, in this sequence or in the inversed sequence. This results in a similar switching mode as the switching mode of the controllable voltage divider 2 shown in FIG. 1.

After each cycle of the numbers 0 to 7, inclusive, the step attenuator 1 must be switched-over, namely such that a switching action is alternately performed in the multiplex circuit K and in the multiplex circuit L. Such a switching mode is realised by using the binary-decimal number at the output terminals $B_7$, $C_3$, $C_2$ and $C_6$ as the switching control signal for the step attenuator 1. When this binary-decimal number changes from odd to even, the connection from the output terminal $K_3$ to one of the output terminals $K_4$, $K_2$, $K_5$, $K_1$, $K_{12}$ and $K_{15}$ is switched to a next output terminal. The binary-decimal number at the three most significant input terminals $H_5$, $H_3$ and $H_1$ then determines which one of the said output terminals is connected to the output terminal $K_3$. When the said binary-decimal number changes from even to odd, then the connection from the output terminal $L_3$ to one of the output terminals $L_1$, $L_2$, $L_4$, $L_5$, $L_{12}$ to $L_{15}$, inclusive, is switched to a next output terminal. Here the three most significant bits of the sum of the binary-decimal number at the input terminals $H_7$, $H_5$, $H_3$, $H_1$ and the binary-decimal number 1000 at the input terminals $H_6$, $H_4$, $H_2$ and $H_5$ determine which one of the said output terminals $L_1$, $L_2$, $L_4$, $L_5$, $L_{12}$ to $L_{15}$, inclusive, is connected to the output terminal $L_3$. The switching mode thus obtained corresponds to the switching mode performed in the step attenuator shown in FIG. 1.

In position I of the change-over switch 86 of voltage at the output 7 decreases with respect to the reference terminal 4 from a value between 0 and $+V$ to 0 Volt in not more than 105 voltage increments. In position II of the change-over switch 86, the voltage at the output increases with respect to the reference terminal 4 from a value between 0 and $+V$ to V volt, of course also in not more than 105 voltage increments. By means of a different mutual connection of the integrated circuits it is alternatively possible to have the output voltage at the output 7 increase in position I of the change-over switch 86 and to have it decrease in position II.

Should an analog voltage increase or decrease be preferred, then the discrete controllable voltage divider 2 must be replaced by an analog controllable voltage divider, not shown, as described in, for example, Netherlands patent application OA No. 7,802,973. The multiplex circuits F and G must then be followed by a digital-to-analog converter to obtain an analog control signal for such an analog controllable voltage divider.

What is claimed is:

1. An attenuation arrangement comprising:
   a step attenuator having two input terminals, a first and a second output terminal and a reference terminal, a series arrangement of n attenuating elements connected between said input terminals, said series arrangement comprising n+1 coupling points, defined respectively as $C_1$, $C_2$, . . . $C_{n+1}$, which successively correspond to the free end of the first attenuating element, the common junctions of the successive attenuating elements and the free end of the last attenuating element in the series arrangement, and a switching circuit arranged between the coupling points and the output terminals for coupling selectably the attenuation elements to said output terminals;
   a voltage divider having two inputs coupled respectively to said first and second output terminals of said step attenuator, a voltage dividing arrangement connected between said inputs, an output and a coupling arrangement for selectably coupling said output to a part of the voltage divider arrangement; and
   a control arrangement for controlling the switching circuit of the step attenuator and the coupling arrangement of the voltage divider,
   characterized in that the switching circuit is arranged to selectably couple the first output terminal with any of the alternate coupling points starting with $C_1$ and to selectably couple the second output terminal with any of the other alternate coupling points starting with $C_2$, whereby when switching the two output terminals of said step attenuator from a first to an adjacent second attenuation element under the control of said control arrangement, the connection through said switching circuit of the common junction between said two adjacent attenuation elements and one of said two output terminals is maintained while the connection from the other one of said output terminals to the end of said first attenuation element, located opposite from the common junction is switched over to the end of the second attenuation element located opposite the common junction thereby preventing the occurrence of voltage peaks.

2. An attenuation arrangement as claimed in claim 1 characterized in that the voltage dividing arrangement of the voltage divider comprises a series arrangement of attenuation elements connected between the two inputs thereof, each end of the attenuation elements being connected to said output under the control of said coupling arrangement.

3. An attenuation arrangement as claimed in claim 2, wherein said control arrangement comprises, a pulse generator, first and second control terminals coupled to said pulse generator, an adding circuit switchably coupled to said first and second control terminals for generating an output signal based on pulses applied to said control terminals wherein pulses applied to said first control terminal increment said output signal while pulses applied to said second control terminal decrement said output signal, and a switching control device coupled to said adding circuit for converting said output signal of said adding circuit into a switching control signal for said step attenuator switching arrangement and said voltage divider coupling arrangement whereby a pulse train applied to one of said two control terminals causes an increase of the output voltage while a pulse train applied to the other of said two control terminals causes a decrease of the output voltage.

4. An attenuation arrangement as claimed in any one of claims 1–3, characterized in that the attenuating elements of the step attenuator divide the voltage applied between the two input terminals into partial voltages which have a relative logarithmic ratio.

* * * * *